United States Patent
Zhuo

(10) Patent No.: US 7,422,707 B2
(45) Date of Patent: Sep. 9, 2008

(54) HIGHLY CONDUCTIVE COMPOSITION FOR WAFER COATING

(75) Inventor: Qizhuo Zhuo, Irvine, CA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 11/651,719

(22) Filed: Jan. 10, 2007

(65) Prior Publication Data

US 2008/0164612 A1    Jul. 10, 2008

(51) Int. Cl.
*H01B 1/00* (2006.01)
*H01B 1/12* (2006.01)

(52) U.S. Cl. .............. 252/500; 252/512; 252/514; 75/252; 257/768; 361/502; 438/689

(58) Field of Classification Search .......... 252/514, 252/512, 500; 438/465, 689; 524/111; 219/121.69; 257/676, 746, 768, 787; 75/252; 361/502
See application file for complete search history.

(56) References Cited

U.S. PATENT DOCUMENTS

| | | | |
|---|---|---|---|
| 3,716,489 A | 2/1973 | DeLapp | |
| 4,552,691 A * | 11/1985 | Shoji et al. ............... | 252/514 |
| 4,564,563 A | 1/1986 | Martin et al. | |
| 4,714,726 A * | 12/1987 | Ketley ....................... | 524/111 |
| 4,933,030 A | 6/1990 | Dietz | |
| 4,946,376 A * | 8/1990 | Sharma et al. ............. | 428/620 |
| 5,003,018 A | 3/1991 | Repecka | |
| 5,011,627 A | 4/1991 | Lutz et al. | |
| 5,165,877 A | 11/1992 | Colin | |
| 5,391,604 A | 2/1995 | Dietz et al. | |
| 5,488,082 A | 1/1996 | Dietz et al. | |
| 5,504,374 A * | 4/1996 | Oliver et al. ............. | 257/746 |
| 5,536,970 A * | 7/1996 | Higashi et al. ........... | 257/676 |
| 5,728,775 A | 3/1998 | Narisawa et al. | |
| 5,747,615 A | 5/1998 | Repecka | |
| 5,856,425 A | 1/1999 | Rosenfeld et al. | |
| 5,897,813 A | 4/1999 | Titomir et al. | |
| 5,955,566 A | 9/1999 | Lee et al. | |
| 6,140,402 A | 10/2000 | Dietz et al. | |
| 6,175,162 B1 * | 1/2001 | Kao et al. .................. | 257/787 |
| 6,265,471 B1 | 7/2001 | Dietz | |
| 6,313,248 B1 | 11/2001 | Boyd et al. | |
| 6,313,428 B1 | 11/2001 | Chen et al. | |
| 6,995,202 B2 | 2/2006 | Lake, Jr. et al. | |
| 6,995,205 B2 | 2/2006 | Matsukawa et al. | |
| 7,186,945 B2 * | 3/2007 | He et al. ................. | 219/121.69 |
| 2003/0162368 A1 * | 8/2003 | Connell et al. ............ | 438/465 |
| 2004/0106291 A1 * | 6/2004 | Ho et al. ................... | 438/689 |
| 2004/0145060 A1 * | 7/2004 | Dominic .................... | 257/768 |
| 2005/0268963 A1 * | 12/2005 | Jordan et al. .............. | 136/256 |
| 2006/0021465 A1 * | 2/2006 | Uchida ..................... | 75/252 |
| 2008/0089012 A1 * | 4/2008 | Kon et al. .................. | 361/502 |

FOREIGN PATENT DOCUMENTS

| | | | |
|---|---|---|---|
| JP | 10-060111 | * | 3/1998 |
| WO | WO 96/13066 | | 5/1996 |
| WO | WO 01/80312 | | 10/2001 |

* cited by examiner

*Primary Examiner*—Mark Kopec
*Assistant Examiner*—Khanh Tuan Nguyen

(57) ABSTRACT

A conductive composition for coating a semiconductor wafer comprises conductive filler that has an average particle size of less than 2 microns and a maximum particle size of less than 10 microns, a first resin that has a softening point between 80-260° C., solvent, curing agent, and a second resin, wherein at room temperature the first resin is substantially soluble in the solvent.

6 Claims, No Drawings

HIGHLY CONDUCTIVE COMPOSITION FOR WAFER COATING

FIELD OF THE INVENTION

This invention relates to conductive coatings for semiconductor wafers.

BACKGROUND OF THE INVENTION

Both organic and inorganic adhesives are used to bond semiconductor dies to various substrates during the assembling of electronic devices. Traditionally, the attachment of the individual die is accomplished by one of three distinct types of attachment: eutectic bonding, solder pre-form, and organic adhesives applied in either film form or as dispensed pastes.

Pre-form bonding involves the use of a small piece of special composition material such as soft solder material that will adhere to both the die and the package. A solder pre-form is placed on the die attach area of a substrate and caused to melt. The die is then scrubbed across the region until the die is attached, and then the assembly is cooled. In another variation of this bonding method solder wire is used to form the bond. Unfortunately, solder materials used for this application are often alloys containing lead, which is considered hazardous to the environment.

Eutectic die attachment involves using a eutectic alloy, such as gold-silicon or gold-germanium. In this method, a layer of the alloy is plated on the backside of the wafer. The wafer is then mounted on dicing tape, diced, and singulated into individual dies. By heating a substrate above the eutectic temperature (e.g. 370° C. for gold-silicon) and placing the die on it, a bond is formed between the die and substrate. When the temperature is lowered, the bond strength is rapidly increased as the eutectic composition solidifies, allowing the assembly to immediately proceed forward to the next process step of wire bonding and molding, thus, enabling a high throughput process flow.

The eutectic solder die bonding process is a well-established bonding technique and is widely used for small signal products with small dies such as discrete and power devices including diodes, transistors, and the like. However, the eutectic process requires the use of gold, which is expensive. Additionally, the eutectic process requires the step of plating the gold eutectic material on the back side of the wafer in the wafer fabrication process, which is a costly step not required for most semiconductor devices. Furthermore, these eutectic compositions typically have very high modulus and require extremely high processing temperatures, both of which can produce significant stress in the bond line. This stress can cause die cracking or device failure, especially with newer devices such as radio frequency (RF) power amplifier devices, since they use gallium arsenide semiconductors as opposed to the less fragile conventional silicon die. The stress in the bond line can also be problematic with devices that use thin die, which are inherently more fragile than conventional thicker die. Additionally, the stress is higher when there is a greater coefficient of thermal expansion (CTE) mis-match between the die and lead frame, as is seen when copper lead frames are used instead of, for instance, Alloy 42 which is more expensive.

An alternative to solder and eutectic bonding with lower cost and less bond line stress is therefore desirable. It has been very difficult to find eutectic bonding replacement materials that are able to match the high conductivity of the intermetallic bond formed between the die and substrate, meet all other processing requirements, and utilize existing high throughput process equipment.

One possible replacement material is dispensed conductive paste adhesive. Dispensed paste bonding involves the use of a paste adhesive, such as an epoxy, to attach the die to the package. A drop of paste is dispensed through a dispensing head or needle onto the substrate. Then a singulated die from a wafer is picked up and attached to the dispensed adhesive. The assembly is then typically baked at an elevated temperature to cure the epoxy paste adhesive.

There are four major issues for conductive dispense paste adhesive as a replacement of solder die attach or eutectic bonding. First, as die sizes become smaller there are more dies per wafer, and the time required to dispense the paste can become a limiting factor in the production rate for package assembly.

Second, after the die is attached to the dispensed adhesive, the adhesive flows and forms a fillet around the die. The fillet effectively increases the footprint area of the die, which means that the assembled package must be slightly larger than the die itself. This extra area can be quite substantial, as tolerances must account for variations in fillet size caused by factors such as paste volume and flow variation, and misplacement of paste and die. In addition, since paste adhesives are prone to resin bleed, space must be also left to ensure that surrounding bond pads are not affected by excessive bleed. The need to include this additional surface area is counter to industry requirements for reduced cost and smaller form factors for these devices.

Third, placing a die onto a dot of adhesive paste is a delicate operation. The force and time must be controlled to ensure that the adhesive has completely covered the underside of the die and formed a uniform bond line. Tilting of the die may interfere with the wire-bonding process or negatively impact device reliability by creating regions of high stress where the bond line is thinnest. Paste adhesive sometimes do not dispense uniformly, leading to uneven or inconsistently dispensed dots on the die bonding pads which can cause immediate or long-term electrical failure of the semiconductor device. This is a particularly problematic issue as die become smaller because the dispensing operation and the placement operation are both more difficult to control with smaller die.

Fourth, the conductivity of available adhesive formulations has not been adequate to replace solder and eutectic bonding materials.

The first three limitations listed above for dispensed adhesives have been overcome in recent years through the development of processes and adhesive formulations for wafer backside coating (WBC). Typically the wafer backside coating is a printable, B-stage-able adhesive formulation which is coated on the backside of the wafer by screen or stencil printing. After printing, the coated wafer is heated to evaporate solvent and/or partially advance the resin, so that the coating is hardened to a non-tacky state. The wafer is then laminated onto dicing tape, diced, and singulated into individual dies with an adhesive layer on the die backside. The die can then be attached to a substrate using heat and pressure. After die attach, the adhesive is typically cured in either a snap or oven cure process.

The WBC method largely overcomes the first three limitations mentioned for the adhesive dispense process, enabling a high throughput process with uniform adhesive coverage, minimal die tilt, and limited (if any) tolerances required for fillet and bleed of the adhesive.

The WBC process is also advantageous compared to the eutectic bonding process because it utilizes the exiting manufacturing infrastructure but does not require the costly gold plating step in wafer fabrication. Additionally, organic adhesives such as those used in the typical WBC process can be easily tailored to have lower stress than gold-silicon eutectic compounds, since they require lower processing temperatures to form a bond and have lower inherent modulus.

Adhesives for WBC must meet several performance requirements. First, they must have rheology that enables printing (the specific rheology that is required varies by application, depending on such factors as the force to be applied during printing and the thickness of the coating to be applied). Second, after print and B-stage the coating must have a smooth surface, with very low surface roughness (Rz) values being desirable, and targets of less than 10 microns typical (though the specific Rz value required will depend upon the die size, thickness of adhesive on the dicing tape, and other process-specific variables). A smooth coating surface is especially important with small die because each die has a small amount of surface area in contact with the dicing tape. If the surface of the coating is too rough that contact will be poor, and will offer insufficient strength to hold the die to the dicing tape during the sawing operation, resulting in "die fly", an undesirable phenomenon in which the die delaminates from the tape during dicing, making it impossible to pick it up for bonding to a substrate. Furthermore, a rough coating surface can result in poor bond line thickness control and "die tilt" (when the die is not flat on the substrate after die attach and cure), both of which can lead to failure of the semiconductor device. Third, after the coating has been printed and B-staged, it must be stable at room temperature so that the coated wafer may be handled and stored for some period of time (generally a few days to a few months). Fourth, the coating must have good mechanical strength to pass the dicing and pick up process.

An additional critical performance requirement is that after the adhesive has been cured it must be capable of supporting the die through the wire bonding process, without the die moving, tilting, or delaminating from the substrate. This requirement is a particular challenge with small die (less than 2×2 mm) because of the very small surface area that is in contact with the substrate, as the die tends to move very easily. Generally the adhesive must have both high modulus and high adhesion at the wire bonding temperatures (typically 200 to 320° C.) in order to support the die. A typical target for modulus is greater than 500 MPa at the wire bonding temperature to be used. Adhesion targets vary widely and depend largely upon die size.

In the situation where WBC materials are directly replacing eutectic bonding materials, the adhesive must also meet additional requirements. First, they must have very high thermal conductivity, with requirements ranging from 8-10 W/mK in some applications and 20-30 W/mK in others. Second, they must have very high electrical conductivity, with volume resistivity targets on the order of $10^{-5}$ ohm-cm. Third, they must cure very quickly (typically in less than 20 seconds) so that the cure may take place on the die bonder during die attach, with sufficient bond strength to enable the assembly to go directly to wire bonding without a time-consuming oven cure step. This enables utilization of existing bonding equipment and the high throughput typically required to replace eutectic materials. Since existing eutectic bonders can heat up to over 400° C. the substrate can be heated to temperatures that are much higher than the cure onset temperature of most organic systems, so the onset temperature of the cure is not typically critical. However, lower cure temperatures are generally preferred to minimize stress introduced into the assembly, with a target of less than 300° C. typical. If the WBC material is not replacing a eutectic material extremely fast cure may be desirable but not critical, since often an oven cure step that may take longer can be tolerated.

Traditional dispensable conductive pastes have thermal conductivity values of up to about 5 W/mK, which is inadequate for many applications, especially those where eutectic bonding materials are being replaced. Higher conductivity is sometimes achieved using one of several alternative methods. In one method the practitioner incorporates a "low melting point" metal alloy powder into a composition containing a matrix resin powder and a conductive filler that comprises at least a copper powder and graphite powder. However, this composition is not suitable for WBC for numerous reasons. First, the powder mixture of the composition is not suitable for printing. Second, the carbon fiber is too large to give satisfactory print surface. Third, the copper in this composition is susceptible to oxidation when exposed to air. Since WBC adhesives are exposed to air during printing and storage of the wafer, copper is a non-preferred filler for this application.

In a second method high conductivity is achieved by utilizing a composition of conductive metal fillers, solid resins, and fugitive solvent that does not substantially dissolve the resins. This method is not suitable for WBC, however, because it is not printable. Because the resin is not dissolved in the fugitive solvent, these formulations have an extremely high solid content in the paste composition. Typically, pastes with very high solids content have highly thioxtropic rheology, meaning that their viscosity at low shear rates is high and their viscosity at high shear rates is low. This type of behavior gives poor leveling of the adhesive after printing, since low viscosity at low shear rates is required for the adhesive to flow slightly and fill in any small lines or imperfections present after the printing process. Poor adhesive leveling typically results in high surface roughness. Furthermore, the solid resin present in this composition may be very large (up to 110 μm), which will cause a rough surface after printing.

Prior materials have been unable to meet the complex combination of performance properties required for WBC. It would be highly desirable, therefore, to have a material that can be printed and B-staged with a resulting smooth surface, has high electrical and thermal conductivity after cure, and has fast cure. In situations where the WBC material was to be used on small die it would further be desirable to have high mechanical strength at high temperatures.

SUMMARY OF THE INVENTION

This invention is a conductive composition for coating a semiconductor wafer comprising: (a) 66 to 80 wt % conductive filler that has an average particle size of less than 2 microns and a maximum particle size of less than 10 microns; (b) 5 to 25 wt % first resin that has a softening point between 80-260° C.; (c) 5 to 25 wt % solvent; (d) 0 to 5 wt % curing agent; and (f) 0 to 20 wt % second resin; wherein at room temperature the first resin is substantially soluble in the solvent. The composition is printable, has a smooth surface after B-staging, and has high electrical and thermal conductivity after cure.

In one embodiment this invention is the conductive composition described above in which the first resin is a bismaleimide. This composition is printable, has a smooth surface after B-staging, high electrical and thermal conductivity, fast cure, and high strength after cure at wire bonding temperatures.

This invention is also a method for increasing the conductivity of a coating on a semiconductor wafer comprising: (a) providing a semiconductor wafer having a front side that is active and a back side opposed to the front side that is inactive; (b) providing a conductive composition comprising (i) 66 to 80 wt % conductive filler that has an average particle size of less than 2 microns and a maximum particle size of less than 10 microns, (ii) 5 to 25 wt % first resin that has a softening point between 80-260° C., (iii) 5 to 25 wt % solvent, (iv) 0 to 5 wt % curing agent, and (v) 0 to 20 wt % second resin; wherein at room temperature the first resin is substantially soluble in the solvent; (c) coating the back side of the semiconductor wafer with the conductive composition; (d) evaporating the solvent from the conductive composition to effect the partial precipitation of the first resin from the conductive composition, at a temperature that is no higher than 30° C. above the softening point of the first resin; and (e) curing the conductive composition.

Definitions

The term "conductive" as used herein encompasses both thermal and electrical conductivity, unless otherwise specified.

The term "thermal conductivity" as used herein is defined as the time rate of transfer of heat by conduction, through unit thickness, across unit area for unit difference of temperature. Unless otherwise specified, thermal conductivity values cited herein are measured using the laser flash thermal conductivity testing method.

The term "electrical conductivity" as used herein is defined as the quantity of electricity transferred across unit area, per unit potential gradient per unit time, and is the reciprocal of resistivity. Unless otherwise specified, electrical resistivity and conductivity values cited herein are measured using a GenRad 1689 Precision Digibridge RLC tester.

The term "alkyl" as used herein refers to a branched or un-branched saturated hydrocarbon group of 1 to 24 carbon atoms, such as methyl ("Me"), ethyl ("Et"), n-propyl, isopropyl, n-butyl, isobutyl, t-butyl, octyl, decyl, and the like.

The term "effective amount" of a compound, product, or composition as used herein is meant a sufficient amount of the compound, product or composition to provide the desired results. As will be pointed out below, the exact amount required will vary from package to package, depending on the particular compound, product or composition used, its mode of administration, and the like. Thus, it is not always possible to specify an exact amount; however, an effective amount may be determined by one of ordinary skill in the art using only routine experimentation.

As used herein, the term "suitable" refers to a moiety that is compatible with the compounds, products, or compositions as provided herein for the stated purpose. Suitability for the stated purpose may be determined by one of ordinary skill in the art using only routine experimentation.

As used herein, "substituted" is used to refer, generally, to a carbon or suitable heteroatom having a hydrogen or other atom removed and replaced with a further moiety. Moreover, it is intended that "substituted" refer to substitutions which do not change the basic and novel utility of the underlying compounds, products or compositions of the present invention.

As used herein, the term "B-staging" (and its variants) is used to refer to the processing of a material by heat or irradiation so that if the material is dissolved or dispersed in a solvent, the solvent is evaporated off with or without partial curing of the material, or if the material is neat with no solvent, the material is partially cured to a tacky or more hardened state. If the material is a flow-able adhesive, B-staging will provide extremely low flow without fully curing, such that additional curing may be performed after the adhesive is used to join one article to another. The reduction in flow may be accomplished by evaporation of a solvent, partial advancement or curing of a resin or polymer, or both.

As used herein the term "curing agent" is used to refer to any material or combination of materials that initiate, propagate, or accelerate cure of the composition and includes but is not limited to accelerators, catalysts, initiators, and hardeners.

As used herein the term "particle size" is used to refer to the largest dimension of the particle. For instance, if the particle is spherical the particle size is equivalent to the diameter of the particle, and if the particle is a flake the particle size is the length of the flake.

DETAILED DESCRIPTION OF THE INVENTION

The conductive composition of this invention contains 66 to 80 wt % conductive filler characterized by an average particle size of less than 2 microns and a maximum particle size of less than 10 microns. The small size of the filler is critical for two reasons. First, it results in a high surface area on the filler and gives tight packing of particles, both of which increase conductivity. Second, small filler particles result in a smoother surface after B-stage, which minimizes problems with die fly, die tilt, and bondline thickness control. In one embodiment the composition contains between 68 and 75 wt % conductive filler.

Silver is a preferred conductive filler when both electrical and thermal conductivity are required, although any thermally and electrically conductive filler may be used. Examples of suitable electrically and thermally conductive fillers include carbon black, graphite, gold, silver, silver-coated copper, platinum, and palladium. In some situations it may be desirable to have thermal conductivity without high electrical conductivity. Examples of suitable fillers that are thermally conductive and electrically insulative include silicon carbide, boron nitride, diamond, and alumina. The conductive filler may be of any shape, although non-spherical shapes such as flakes are preferred.

In the embodiment in which the filler is silver the filler particles must have a surface area of at least $1\ m^2/g$. This very high surface area may be achieved by using either small filler, or a blend of very small filler and larger filler such as might be present in a bi-modal distribution.

The conductive composition of this invention contains between 5 to 25 wt % of a first resin. The first resin may comprise a single monomer, polymer, copolymer, or oligomer, or it may comprise a mixture of more than one, as long as each meets the criteria specified below for softening point and solubility.

The first resin of the conductive composition is substantially soluble in the solvent of this conductive composition at room temperature (25° C.). It is critical that the first resin remain in solution during application to the wafer as this ensures that the resin wets the filler surface, resulting in very little filler agglomeration (good dispersion of the filler) in the resin matrix during printing. This assists in the production of a smooth coating surface.

The first resin of this composition has a softening point that is between 80° C. and 260° C. The softening point must be near or above the B-stage temperature to be used, and should be no lower than 30° C. below the B-stage temperature. B-stage temperatures vary according to the solvent, resin, and process employed, and typically are between 80-140° C. Furthermore, the first resin must have a softening point that is below the die attach temperature to be used. Die attach temperatures are higher than B-stage temperatures and vary according to the resin, die bonder, and process parameters such as die size, die attach force and time, and substrate utilized. Typically, a die attach temperature of less than 200° C. is desirable, and in those situations the softening point of the first resin must be between 80° C. and 200° C. In applications where solder or eutectic bonding materials are being replaced the die attach temperature may be as high as 300° C., and in those cases the first resin may have a softening point that is between 80° C. and 260° C.

The softening point of the first resin is critical. The first resin must be substantially solid or very highly viscous at the B-staging temperature that is selected, as this gives the best conductivity results. Though not wishing to be bound by theory, it is believed that during B-staging, as the solvent evaporates, the solid resin reaches a concentration exceeding its saturation point within the solvent(s). Since the first resin is solid or highly viscous at this temperature, it partially precipitates out of solution during B-staging, enabling the silver to agglomerate significantly. The fact that the resin precipitates out of solution to form small solid particles and/or a highly viscous liquid means that the resin has lower wettability on the filler surface. This allows the conductive filler particles to contact one another more intimately, forming more filler agglomerations, with a minimal amount of resin adsorbed on the surface of the conductive filler, enhancing both electrical and thermal conductivity. If the first resin(s) are low viscosity liquids at the B-staging temperature (i.e. if they have a softening point that is well below the B-stage temperature such that they are flowing very freely during B-stage) the filler will remain in a uniform dispersion within the liquid, the liquid resin will have high wetting on the filler surface and more freely adsorb onto the filler surface, and there will be a more pronounced resin layer between the filler particles, which will negatively impact conductivity. Furthermore, the resin must flow at die attach temperatures to a degree sufficient to wet out a substrate under pressure, and therefore must have a softening point that is below the die attach temperature to be employed. In this way, after the coating has been B-staged, the wafer has been diced, and the dies have been singulated, the die may be attached to the substrate with heat and pressure, and the resin will flow to form a bond with the substrate.

The size and shape of the first solid resin before inclusion in the conductive composition is not critical since it is dissolved in the solvent upon mixing.

In one embodiment the first resin flows (softens and/or melts) between 80° C. and 260° C. In another embodiment the first resin flows between 80° and 200° C. Examples of suitable first solid resins include monomers, oligomers, copolymers, and polymers with reactive functional groups, or a combination of these. The first resin is capable of being transformed into a crosslinked thermoset polymer once exposed to an elevated temperature which is higher than the B-stage temperature, in the presence of suitable curing agents (if required).

Suitable reactive functional groups for the first resin include but are not limited to maleimide, itaconimide, nadimide, acrylate, methyacrylate, styrenyl, epoxy, vinyl, phenol, hydroxyl, siloxane, and carboxyl. Maleimide functional groups are especially well-suited for these conductive compositions because of their ability to cure extremely quickly, and because they have high strength at high temperatures.

Solid bismaleimide (BMI) resins suitable for inclusion as the first resin include those having the structure

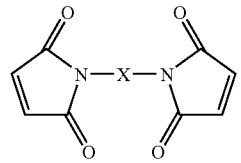

in which X is an aromatic group; exemplary aromatic groups include:

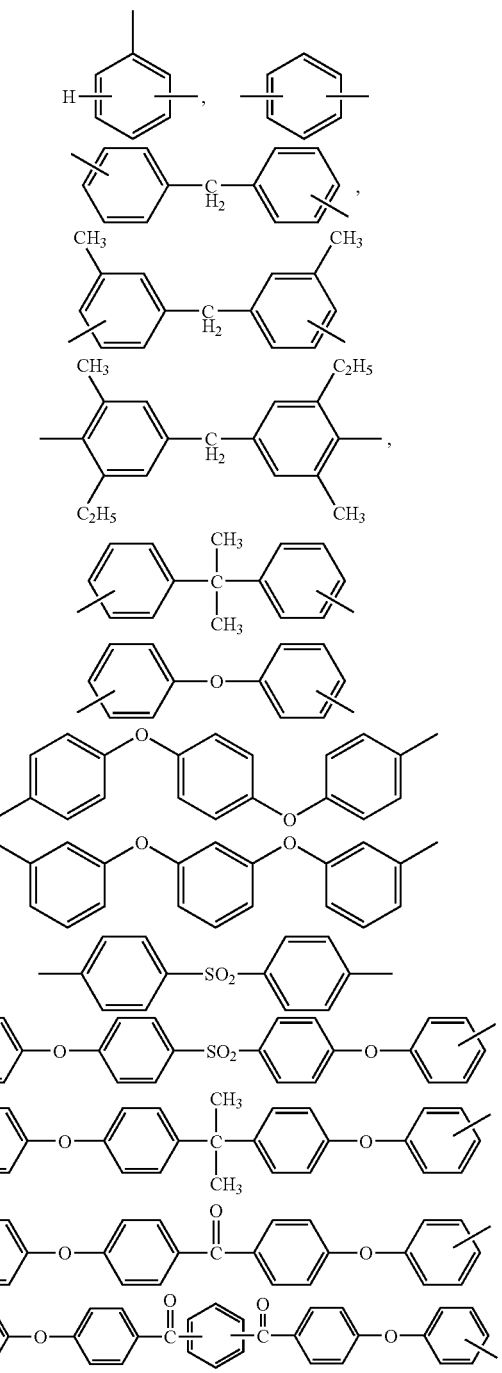

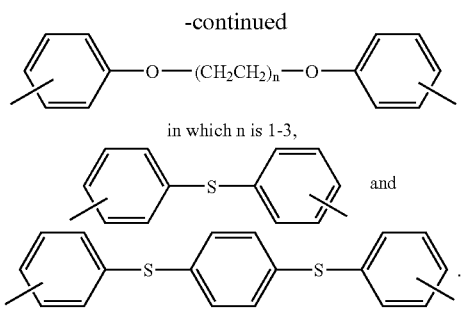

in which n is 1-3, and

.

Bismaleimide resins having these X bridging groups are commercially available, and can be obtained, for example, from Daiwakasei Industry Co., LTD (Japan) or HOS-Technic GmbH (Austria).

In one embodiment the first resin is 3,3-dimethyl-5,5-diethyl-4,4-diphenylmethane-bismaleimide. This resin is commercially available and can be obtained, for example, from Daiwa Kasei Ind. Co. Ltd. (Japan).

In another embodiment the first resin is a bismaleimide resin according to the following structure:

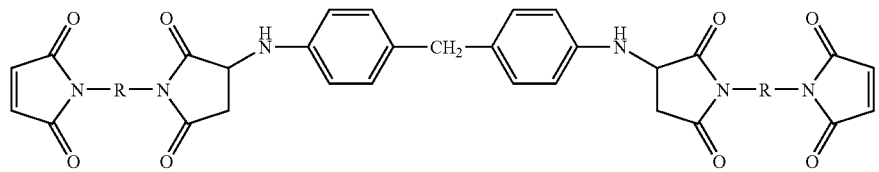

This bismaleimide is commercially available and can be obtained, for example, as Homide 250 from Hos-Technik GmbH.

Additional solid maleimide resins suitable for use as the first resin include those having the generic structure

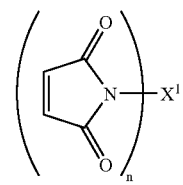

in which n is 1 or greater and $X^1$ is an aliphatic or aromatic group. Exemplary $X^1$ entities include polyimide, poly(carbonates), poly(urethanes), poly(esters), simple hydrocarbons, and simple hydrocarbons containing functionalities such as imide, amine, carbonyl, carboxyl, amide, carbamate, urea, or ether. These types of resins are commercially available and can be obtained, for example, from Daiwakasei Industry Co., LTD (Japan) or HOS-Technic GmbH (Austria).

Acrylate resins suitable for use as the first resin include those having the generic structure

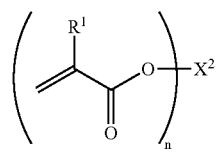

in which n is 1 or greater, $R^1$ is —H or —$CH_3$, and $X^2$ is an aromatic or aliphatic group. Exemplary $X^2$ entities include polyimide, poly(carbonates), poly(urethanes), poly(ethers), poly(esters), simple hydrocarbons, and simple hydrocarbons containing functionalities such as imide, amine, carbonyl, carboxyl, amide, carbamate, urea, or ether.

Styrene resins suitable for use as the first resin include those resins having the generic structure

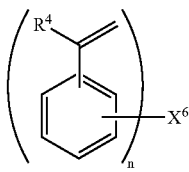

in which n is 1 or greater, $R^4$ is —H or —$CH_3$, and $X^6$ is an aliphatic group. Exemplary $X^6$ entities include, polyimide, poly(carbonates), poly(urethanes), poly(ethers), poly(esters), simple hydrocarbons, and simple hydrocarbons containing functionalities such as imide, amine, carbonyl, carboxyl, amide, carbamate, urea, or ether. These resins are commercially available and can be obtained, for example, from National Starch and Chemical Company or Sigma-Aldrich Co.

The conductive composition of this invention contains 5 to 25 wt % solvent. The solvent may comprise either a single solvent or a combination of multiple solvents, as long as each solvent selected meets the criteria set forth below. The solvents may be any that substantially dissolves first solid resin at room temperature, do not significantly volatilize the coating during the printing operation (typically done at room temperature), and are able to escape from the coating during B-staging. B-staging is typically done between 80° C. and 140° C., with 100° C. to 120° C. being a preferred range, although temperatures outside of these ranges may be utilized depending on the manufacturing requirements and specific resins and solvents chosen for a particular formulation. If a substantial amount of solvent remains after B-staging it can become entrapped in the bond line between the die and the substrate. Upon heating to cure the coating material the solvent will volatilize and may cause voids in the adhesive bond line, which can lead to device failure. The boiling point of the solvent selected will depend upon the manufacturing process and resin chemistry employed, with a preferred range of 150° C. to 230° C.

Selection of a particular solvent or combination of solvents depends upon the solid resin chosen and processing conditions to be utilized. Suitable solvents include but are not limited to ketones, esters, alcohols, ethers, and other common solvents that are stable. Suitable solvents include y-butyrolactone, propylene glycol methyl ethyl acetate (PGMEA), 1,1,3,3-tetramethyl urea, N-methyl pyrrolidone, N-ethyl pyrrolidone, and 2-(2-ethoxyethoxy)ethyl acetate.

The conductive composition of this invention contains 0 to 5 wt % curing agent. If curing agent is required, its selection is dependent on the polymer chemistry used and the processing conditions employed. The curing agent must activate at a temperature higher than the B-stage temperature so that the solvent may be removed before substantial curing begins. Additionally, the curing agent must be "latent" in that it will not significantly advance the resin(s) at room temperature for at least 1 week after B-staging. This enables the B-staged wafer to be stored and handled before die singulation, attach, and cure, while retaining the adhesive capability of the formulation. As curing agents, the compositions may use free radical initiators, cationic initiators, aromatic amines, alycyclic amines, triazines, metal salts, aromatic hydroxyl compounds, sulfones, or a combination of these.

Examples of such catalysts include carbamic acid amide, dicyandiamide, 3,3-diamino diphenyl sulfone, 4,4'-diamino diphenyl sulfone, latent imidazoles such as 2,4-diamino-6-(2-(2-ethyl-4-methyl-1-imidazolyl)ethyl)-1,3,5-triazine, or encapsulated imidazoles; phenols, such as phenol, cresol, xylenol, resorcine, and phloroglucin; peroxides, such as dicumyl peroxide and cumene hydroperoxide; metal chelates; acid anhydrides, such as carboxylic acid anhydride, maleic anhydride, phthalic anhydride, pyromellitic anhydride, trimellitic anhydride, hexahydrophthalic anhydride; hexahydropyromellitic anhydride and hexahydrotrimellitic anhydride; and mixtures thereof.

Additional curing agents that may be included effect fast curing at low temperatures. These must be present either in very small amounts to accelerate the cure of the primary curing agents, or in an encapsulated form to ensure latency at room temperature. Examples of such curing agents include but are not limited to imidazoles such as 2-methylimidazole, 2-undecylimidazole, 2-heptadecyl imidazole, 2-phenylimidazole, 2-ethyl 4-methylimidazole, 1-benzyl-2-methylimidazole, 1-propyl-2-methylimidazole, 1-cyanoethyl-2-methylimidazole, 1-cyanolethyl-2-ethyl4-methylimidazole, 1-cyanoethyl-2-undecylimidazole, 1-cyanoethyl-2-phenylimidazole, 1-guanaminoethyl-2-methylimidazole and addition product of an imidazole and trimellitic acid; tertiary amines, such as N,N-dimethyl benzylamine, N,N-dimethylaniline, N,N-dimethyltoluidine, N-N-dimethyl-p-anisidine, p-halogeno-N,N-dimethylaniline, 2-N-ethylanilino ethanol, tri-n-butylamine, pyridine, quinoline, and N-methylmorpholine.

In some cases, it may be desirable to use more than one type of cure. For example, both cationic and free radical initiation may be desirable, in which case both free radical cure and ionic cure resins can be used in the composition. These compositions would contain effective amounts of initiators for each type of resin utilized in the formulation.

Other components, typically used in conductive compositions, may be added at the option of the practitioner; such other components include, but are not limited to, conductivity promoters, fluxing agents, surfactants, wetting agents, flow control agents, adhesion promoters, air release agents, and tackifying resins. The composition will typically contain minimal amounts of these components, and they must be selected so as not to adversely affect conductivity and other performance requirements cited previously.

In one embodiment, a conductivity promoter is added to the conductive composition. Suitable conductivity promoters include but are not limited to short chain aliphatic acids, such as adipic acid, citric acid, glutaric acid, and succinic acid. Conductivity promoter, if used, will be used in an effective amount: a typical effective amount is up to 1% by weight.

In one embodiment, a fluxing agent is added to the conductive composition. The fluxing agent primarily removes metal oxides and prevents re-oxidation of solder bumps. Fluxing agent selection will depend on the resin chemistry and bump metallurgy utilized. However, some of the key requirements of the fluxing agent are that it should not affect the curing of the resin(s), should not be too corrosive, should not outgas too much during reflow, should be compatible with the resin(s), and/or the flux residues should be compatible with the resin(s), and should not adversely affect conductivity and storage life.

Examples of suitable fluxing agents include compounds that contain one or more hydroxyl groups (—OH), or carboxylic (—COOH) group or both, such as organic carboxylic acids, anhydrides, and alcohols, for example, rosin gum, dodecanedioic acid (commercially available as Corfree M2 from Aldrich), sebasic acid, polysebasic polyanhydride, maleic acid, hexahydrophthalic anhydride, methyl hexahydrophthalic anhydride, ethylene glycol, glycerin, tartaric acid, adipic acid, citric acid, malic acid, glutaric acid, glycerol, 3-[bis(glycidyl oxy methyl)methoxy]-1,2-propane diol, D-ribose, Dcellobiose, cellulose, and 3-cyclohexene-I,I-dimethanol. Other fluxing agents include organic alcohols. Fluxing agents may also be compounds having (i) an aromatic ring, (ii) at least one —OH, —NHR (where R is hydrogen or lower alkyl), or —SH group, (iii) an electron-withdrawing or electron-donating substituent on the aromatic ring, and (iv) no imino group. Fluxing agents, if used, will be present in an effective amount; typically, an effective amount ranges from 0.1 to 1% by weight.

In another embodiment a wetting agent may be included in the conductive composition. Wetting agent selection will depend on the application requirements and the resin chemistry utilized. Wetting agents, if used, will be used in an effective amount: a typical effective amount is up to 1% by weight. Examples of suitable wetting agents include castor oil, glycerin or other fatty acids or esters.

In another embodiment, an adhesion promoter may be included in the conductive composition. Adhesion promoter selection will depend on the application requirements and resin chemistry employed. Adhesion promoters, if used, will be used in an effective amount: an effective amount is typically up to 1% by weight. Examples of suitable adhesion promoters include: silane coupling agents such as Z6040 epoxy silane available from Dow Corning; A186 Silane, A187 Silane, A174 Silane, or A1289 available from OSI Silquest; Organosilane S1264 available from Degussa; Johoku Chemical CBT-1 Carbobenzotriazole available from Johoku Chemical; functional benzotriazoles; thiazoles; titanates; and zirconates.

In a further embodiment, an air release agent (de-foamer) may be added to the conductive composition. Air release agent selection will depend on the application requirements and resin chemistry employed. Air release agents, if used, will be used in an effective amount: an effective amount will be up to 1% by weight. Examples of suitable air release agents include Antifoam 1400 available from Dow Corning, DuPont Modoflow, and BYK A-510.

In some embodiments these compositions are formulated with tackifying resins in order to improve adhesion and introduce tack; examples of tackifying resins include naturally-occurring resins and modified naturally-occurring resins; polyterpene resins; phenolic modified terpene resins; coumarons-indene resins; phthalate esters; hydrogenated rosins and hydrogenated rosin esters. Tackifying resins, if used, will be used in an effective amount: an effective amount will be up to 2% by weight.

Other additives, such as stabilizers, antioxidants, inhibitors, impact modifiers, and colorants, in types and amounts known in the art, may also be added to the conductive composition.

The conductive composition of this invention contains between 0 to 20 wt % of a second resin. This second resin may be used to adjust the physical properties of the composition to, for instance, increase toughness (decrease brittleness) after B-staging, increase adhesion, and/or increase the crosslinking and strength of the cured adhesive. The softening point of the second resin is not especially critical, except that it must be below the die attach temperature to be utilized so that the adhesive may flow to form a bond with the substrate. Although it is preferred that the second resin be a solid at room temperature, it may also be a liquid. If the second resin is a liquid at room temperature it must have a high molecular weight (be highly viscous), so that it will have a high viscosity during B-staging. If the second resin is a liquid at room temperature and has a low molecular weight it will have a low viscosity during B-staging and will be more likely to reduce the effect of the first resin and also will be more likely to adsorb onto the filler surface and inhibit conductivity. If the second resin has a low molecular weight it must have a melting point that is above the B-staging temperature. It is preferred that the second resin be soluble in the solvent of this composition. If the second resin is not soluble in the solvent of this composition it must be used in an amount that does not affect the rheology of the formulation (to ensure good print quality), and it must have a particle size that is smaller than the print layer thickness (typically at least 25 microns), with an average size of preferably less than 10 microns to ensure low surface roughness after B-staging. The ratio of second resin content to first resin content in the overall formulation must be less than 1. The second resin has reactive functional groups and may comprise a single monomer, polymer, copolymer, or oligomer, or it may comprise a mixture of more than one. Suitable reactive functional groups for the second resin include but are not limited to maleimide, itaconimide, nadimide, acrylate, methyacrylate, styrenyl, epoxy, vinyl, phenol, hydroxyl, siloxane, and carboxyl.

All resins suitable for use as the first resin are also suitable for use as the second resin. Listed below are additional materials that are also suitable.

Maleimide resins suitable for use as the second resin include those having the generic structure

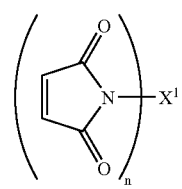

in which n is larger than 1 and $X^1$ is an aliphatic or aromatic group. These types of resins are commercially available and can be obtained, for example, from Daiwakasei Industry Co., LTD (Japan) or HOS-Technic GmbH (Austria). Exemplary $X^1$ entities may also include polymeric groups, such as CTBN rubber or poly(butadiene), poly(ethers), polyesters, polyurethanes, acrylate rubbers, and bitrile butadiene rubber (NBR).

In one embodiment the second resin is 4,4 Bismaleimidodiphenylmethane. This type of resin is commercially available and can be obtained, for example, from Ciba Specialty Chemicals as Matrimid 5292A.

Additional maleimide resins suitable as the second resin include those selected from the group consisting of

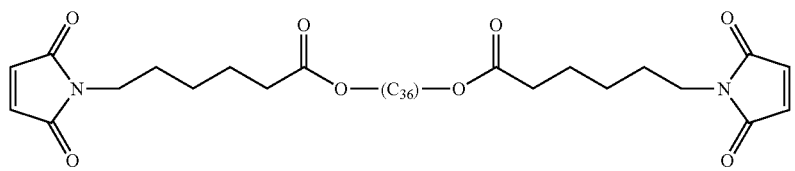

in which $C_{36}$ represents a linear or branched chain (with or without cyclic moieties) of 36 carbon atoms;

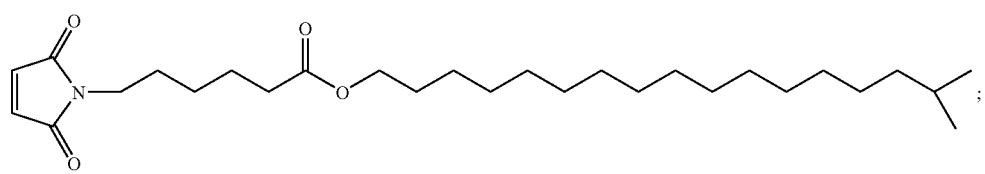

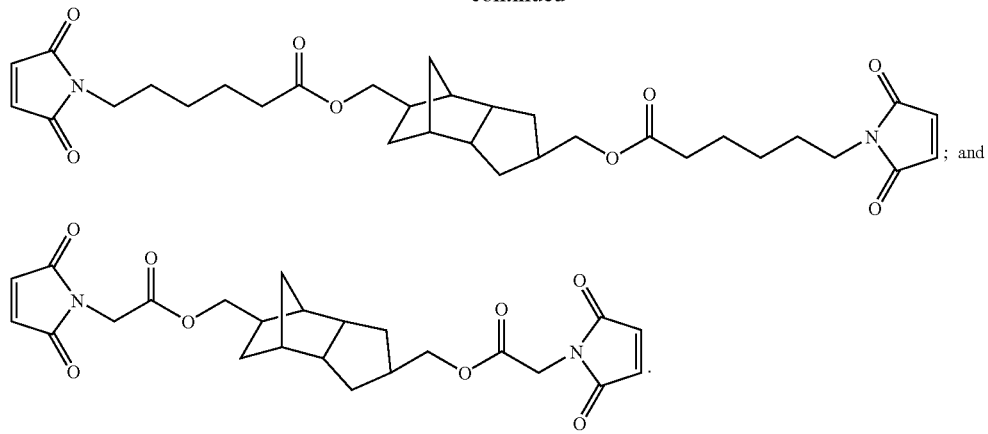

Thermoplastic rubbers suitable as the second resin include carboxy terminated butadiene-nitrile (CTBN)/epoxy adduct cuh as EPON 580003, EPON 580005, EPON 580006, EPON 58120, and EPON 58901 from Hexion Specialty Chemicals.

Acrylates suitable as the second resin include polypentoxylate tetrahydrofurfuryl acrylate, available from Kyoeisha Chemical Co., LTD; polybutadiene urethane dimethacrylate (CN302, NTX6513) and polybutadiene dimethacrylate (CN301, NTX6039, PRO6270) available from Sartomer Company, Inc; polycarbonate urethane diacrylate (ArtResin UN9200A) available from Negami Chemical Industries Co., LTD; acrylated aliphatic urethane oligomers (Ebecryl 230, 264, 265, 270,284, 4830, 4833, 4834, 4835, 4866, 4881, 4883, 8402, 8800-20R, 8803, 8804) available from Radcure Specialities, Inc; polyester acrylate oligomers (Ebecryl 657, 770, 810, 830, 1657, 1810, 1830) available from Radcure Specialities, Inc.; and epoxy acrylate resins (CN104, 111, 112,115,116,117, 118,119,120, 124, 136) available from Sartomer Company, Inc.; poly(butadiene) with acrylate functionality and poly(butadiene) with methacrylate functionality.

Vinyl ethers suitable as the second resin include those having the generic structure

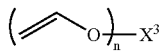

in which n is 1 to 6 and $X^3$ is an aromatic or aliphatic group. Exemplary $X^3$ entities include poly(carbonates), poly(urethanes), poly(ethers), poly(esters), simple hydrocarbons, and simple hydrocarbons containing functionalities such as carbonyl, carboxyl, amide, carbamate, urea, or ether.

Poly(butadienes) suitable as the second resin include epoxidized poly(butadienes), maleic poly(butadienes), and acrylated poly(butadienes). Commercially available materials include maleinized poly(butadiene) (Ricon 130MA8, 130MA13, 130MA20, 131MA5, 131MA10, 131MA17, 131MA20, 156MA17) available from Sartomer Company, Inc.; acrylated poly(butadienes) (CN302, NTX6513, CN301, NTX6039, PRO6270, Ricacryl 3100, Ricacryl 3500) available from Sartomer Inc.; epoxydized poly(butadienes) (Polybd 600, 605) available from Sartomer Company. Inc. and Epolead PB3600 available from Daicel Chemical Industries, Ltd.

Epoxy resins suitable as the second resin include bisphenol, naphthalene, and aliphatic type epoxies. Other suitable epoxy resins include cycloaliphatic epoxy resins, bisphenol-A type epoxy resins, bisphenol-F type epoxy resins, epoxy novolac resins, biphenyl type epoxy resins, naphthalene type epoxy resins, dicyclopentadiene-phenol type epoxy resins, and mixtures thereof. Examples of commercially available materials include epoxy novolac resin Epiclon N665, Epiclone N680, Epiclone N685 available from Dainippon Ink & Chemicals, Inc.; DER series solid Bisphenol A epoxy resin and DEN series solid epoxy novolac resin from Dow Chemical, Epoxy novolac resin Epon 160, Epon 161, Epon 164, Epon SU2-5, Epon SU-3, and Epon SU-8 from Hexion Specialty Chemicals.

Silicone resins suitable as the second resin include reactive silicone resins having the generic structure

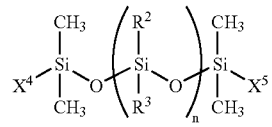

in which n is 0 or any integer, $X^4$ and $X^5$ are amine, epoxy, carboxyl, hydroxy, acrylate, methacrylate, mercapto, phenol, or vinyl functional groups, $R^2$ and $R^3$ can be —H, —CH$_3$, vinyl, phenyl, or any hydrocarbon structure with more than two carbons. Commercially available materials are available and can be obtained, for example, from Shin-Etsu Silicone International Trading (Shanghai) Co., Ltd.

Styrene resins suitable as the second resin include those resins having the generic structure

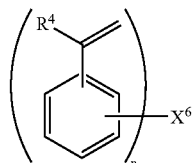

in which n is 1 or greater, $R^4$ is —H or —CH$_3$, and $X^6$ is an aliphatic group. Exemplary $X^6$ entities include, poly(carbonates), poly(urethanes), poly(ethers), poly(esters), and simple hydrocarbons containing functionalities such as carbonyl, carboxyl, amide, carbamate, urea, or epoxy. These resins are commercially available and can be obtained, for example, from National Starch and Chemical Company or Sigma-Aldrich Co.

Suitable polymers for the second resin further include polyamide, phenoxy, polybenzoxazine, polyether sulfone, polyimide, benzoxazine, siliconized olefin, polyolefin, polybenzoxyzole, polyester, polystyrene, polycarbonate, polypropylene, poly(2-vinylpridine), cis-1,4-polyisoprene, vinyl copolymer, polyformaldehyde, polyacetaldehyde, poly (b-propiolacetone), poly(10-decanoate), poly(ethylene terephthalate), polycaprolactam, poly(11-undecanoamide), poly(m-phenylene-terephthalamide), poly(tetramethlyene-m-benzenesulfonamide), polyester polyarylate, poly(phenylene oxide), poly(phenylene sulfide), polysulfone, polyimide, polyetheretherketone, polyetherimide, fluorinated polyimide, polyimide siloxane, poly-iosindolo-quinazolinedione, polythioetherimide poly-phenyl-quinoxaline, polyquuinixalone, imide-aryl ether phenylquinoxaline copolymer, polyquinoxaline, polybenzimidazole, polybenzoxazole, polynorbornene, poly(arylene ethers), hydroxy (benzoxazole) copolymer, and polybenzimidazole.

Other suitable materials for the second resin include ethylene-vinyl acetate polymers, other ethylene esters and copolymers, e.g., ethylene methacrylate, ethylene n-butyl acrylate and ethylene acrylic acid.

Siloxanes suitable for the second resin include elastomeric polymers comprising a backbone and pendant from the backbone at least one siloxane moiety that imparts permeability, and at least one reactive moiety capable of reacting to form a new covalent bond. Examples of suitable siloxanes include elastomeric polymers prepared from: 3-(tris(trimethylsilyloxy)silyl)-propyl methacrylate, n-butyl acrylate, glycidyl methacrylate, acrylonitrile, and cyanoethyl acrylate; 3-(tris(trimethylsilyloxy)silyl)-propyl methacrylate, n-butyl acrylate, glycidyl methacrylate, and acrylonitrile; and 3-(tris(trimethylsilyloxy)silyl)-propyl methacrylate, n-butyl acrylate, glycidyl methacrylate, and cyanoethyl acrylate.

The conductive composition may be manufactured using conventional adhesive paste manufacturing processes and equipment. Generally the solid resin(s) are first dissolved in the solvent(s) under agitation and heating. This facilitates the dissolution process and reduces processing time, since the resins often take longer to dissolve at room temperature, and/or without agitation.

In manufacturing use, the liquid paste is printed on the backside of a wafer using conventional processes such as stencil printing, jet coating, spin coating, and screen printing.

EXAMPLES

Example formulations were prepared illustrating several embodiments of the inventive composition. Comparative formulations were prepared using filler with an average size above 2 μm, and with a resin that has a softening point below 80° C. All formulations were prepared according to standard adhesive manufacturing techniques.

Each formulation was tested for volume resistivity according to the following procedure. A sample of adhesive approximately 3 mil thick, 0.1 inch wide, and 1 inch long was prepared on a glass slide. The adhesive was B-staged with a 10 minute ramp from room temperature to 120° C. followed by a 1 hour hold at 120° C. It was then cured with a 45 minute ramp to 220° C., with a 2 hour hold at 220° C. The samples were cooled to 25° C. and tested for volume resistivity using a GenRad 1689 Precision RLC Digibridge. The inner probes were placed 1 inch apart, resistance (ohm) was recorded from the instrument, and the volume resistivity was calculated according to the following formula:

$$VR = \frac{R(w \times t)}{l}$$

in which: VR=volume resistivity (ohm-cm); R=measured resistance (ohm); w=width, 0.1 inch; t=thickness, 3 mil; and l=length between inner pair of probes, 1 inch.

At least 3 samples were tested, and an arithmetic mean value was reported for each formulation.

Each formulation was tested for thermal conductivity according to the following procedure. A sample of adhesive approximately 1 inch wide, 0.2 to 0.5 mm thick, and 1 inch long was prepared on a flat PTFE plate. The sample was B-staged and cured according to the same profiles used to prepare the volume resistivity samples. After the sample had cooled to room temperature, a 0.5" diameter specimen disc was cut. The thickness of the specimen was measured to an accuracy of ±2 microns. The specimens, as well as a thermal standard, were coated with graphite spray to give a uniform emissivity. The thermal conductivity was measured using a Homometrix Micro Flash Thermal Properties Instrument. The measurement was repeated three times and at least two specimens were tested for each formulation. An arithmetic mean value was reported.

Each formulation was tested for surface roughness according to the following procedure. The adhesives were applied to a 6" wafer with a 2 mils thick stencil, using a DEK Europa printer. The print speed was 20 mm/s and print force was 1 Kg. The wafer was B-staged and cured according to the profiles used to prepare the volume resistivity samples. The wafer then removed from the oven and cooled to room temperature. Surface roughness was measured on the center area of the wafer using a Zeiss Surfcom 130A contact profilometer at about 40 mm length. The Rz value was recorded. Rz is the arithmetic mean value of the single roughness depths of consecutive sampling lengths and is calculated by the formula:

$$R_z = \frac{\sum_{m=1}^{M} p_m + \sum_{n=1}^{N} v_n}{M + N},$$

in which: $p_m$ is the level of the Mth highest peak within the length l and $v_n$ is the level of the lowest trough to the Nth highest trough within the length l.

It should be noted that the cure profile used to prepare these samples was selected to be higher in temperature, and longer in time, than would generally be practiced in industrial use. This is because multiple resin compositions were being tested for comparison to one another. If a particular composition were not fully cured its conductivity could be affected, and this could lead to inaccurate conclusions about the relative performance of the various formulations. In this testing, the cure profile was selected such that all samples could be fully cured using a single protocol, eliminating any variation in conductivity performance due to incomplete cure of the samples.

Example 1

Effect of First Resin Softening Point

Two formulations were prepared to illustrate the effect of first resin softening point on conductivity. In the Comparative Formulation A, the first resin was a solid bismaleimide resin that had a softening point between 50° C. and 70° C. (designated Bismaleimide-A). The first resin in Inventive Formulation B (designated Bismaleimide-B) was a solid bismaleimide resin that had a softening point between 90° C. and 150° C.

Both formulations contained silver flake filler with an average particle size of 1 µm, a maximum particle size of less than 10 µm, and a surface area of 1.3 m²/g. Both the Bismaleimide-A and the Bismaleimide-B were fully soluble in the tetramethyl urea at room temperature.

Two second resins were used in these formulations. One was a high molecular weight poly carbonate urethane diacrylate oligomer that is a liquid at room temperature (designated Oligomer-A). This material is commonly added as a toughener in adhesive formulations. The other second resin was a short chain bismaleimide with a melting point of 150° C.-160° C. (designated Bismaleimide-C). This resin helped to increase the crosslink density of the Bismaleimide-B, adding strength to the overall formulation.

Table 1 summarizes the composition of the comparative and inventive formulations that were prepared for this example, and the conductivity and surface roughness values measured for each.

TABLE 1

COMPOSITION AND PERFORMANCE OF COMPARATIVE
FORMULATION A AND INVENTIVE FORMULATION B

| Component | Material | Comparative Formulation A | Inventive Formulation B |
|---|---|---|---|
| First resin, wt % | Bismaleimide-A | 10.171 | 0 |
| First resin, wt % | Bismaleimide-B | 0 | 10.171 |
| Solvent 1, wt % | Tetramethyl urea | 10.171 | 10.171 |
| Solvent 2, wt % | 2-(2-Ethoxyethoxy) ethyl acetate | 0.165 | 0.165 |
| Filler 2, wt % | Ag flake, 1 µm avg. | 75 | 75 |
| Curing Agent 1, wt % | Cumene hydroperoxide | 0.203 | 0.203 |
| Second resin, wt % | Oligomer-A | 2.034 | 2.034 |
| Second resin, wt % | Bismaleimide-C | 2.034 | 2.034 |
| Inhibitor, wt % | Methylhydroquinone | 0.018 | 0.018 |
| Conductivity Promoter, wt % | Adipic acid | 0.203 | 0.203 |
| Volume Resistivity, ohms-cm | | 0.0003 | 0.00006 |
| Thermal Conductivity, W/mK | | 3.8 | 21.97 |
| Rz | | 2.917 | 3.2 |

Compared to Comparative Formulation A, Inventive Formulation B demonstrated improved electrical conductivity (lower volume resistivity) and improved (higher) thermal conductivity. Surface roughness values for the two materials were very similar. The only difference between the formulations was the first resin used. Both first resins were bismaleimides, but the Bismaleimide-A softening point was 50-70° C., which is 50-70° C. below the B-stage temperature that was utilized. The softening point of the Bismaleimide-B was 90-150° C., which allowed it to remain substantially in a solid state and/or a highly viscous state during the B-staging operation. This softening point range is no lower than 30° C. below the B-stage temperature (120° C.) used in this testing. Though not wishing to be bound by theory, it is believed that the improved conductivity in Inventive Formulation B was caused by the higher softening point of the first resin. It is believed that during B-staging, as the solvent evaporated, the Bismaleimide-B resin reached a concentration exceeding its saturation point within the solvent(s). Since the Bismaleimide-B is still within its softening point range at this temperature it partially precipitated out of solution during B-staging, forming, in-situ, a dispersion of solidified resin powder, highly viscous resin, and conductive filler on the wafer. It is believed that this reduced the resin wetting on the silver filler and enabled the silver to significantly agglomerate, resulting in a high level of more intimate filler particle contact (i.e. conductive filler aggregates with a minimal amount of resin between the filler particles) and corresponding high thermal and electrical conductivity.

Example 2

Effect of Filler Size

The effect of filler size was illustrated by preparing Comparative Formulation C with silver flake filler having an average particle size of 5.46 µm (maximum particle size 20.5 µm) and Inventive Formulation D with silver flake filler having an average particle size of 1.017 µm (maximum particle size 2.6 µm). Table 2 summarizes the comparative and inventive formulations that were prepared for this example and the conductivity and surface roughness values measured for each.

TABLE 2

COMPOSITION AND PERFORMANCE OF COMPARATIVE
FORMULATION C AND INVENTIVE FORMULATION D

| Component | Material | Comparative Formulation C | Inventive Formulation D |
|---|---|---|---|
| First resin, wt % | Bismaleimide-B | 13.019 | 13.019 |
| Solvent 1, wt % | Tetramethyl urea | 13.019 | 13.019 |
| Solvent 2, wt % | 2-(2-Ethoxyethoxy) ethyl acetate | 0.211 | 0.211 |
| Filler 1, wt % | Ag flake, 5 µm avg. | 68 | 0 |
| Filler 2, wt % | Ag flake, 1 µm avg. | 0 | 68 |
| Curing Agent 1, wt % | Cumene hydroperoxide | 0.260 | 0.260 |
| Second resin, wt % | Oligomer-A | 2.604 | 2.604 |
| Second resin, wt % | Bismaleimide-C | 2.604 | 2.604 |
| Inhibitor, wt % | Methylhydroquinone | 0.023 | 0.023 |
| Conductivity Promoter, wt % | Adipic acid | 0.260 | 0.260 |
| Volume Resistivity, ohms-cm | | 0.005 | 0.00014 |
| Thermal Conductivity, W/mK | | 1.64 | 10.32 |
| Rz | | 5.7 | 2.5 |

The inventive formulation demonstrated improved thermal and electrical conductivity and significantly lower surface roughness compared to the formulation that contained filler with a larger particle size.

Example 3

Epoxy Included in Formulation

An additional inventive formulation was prepared which included a solid cresol novolac epoxy resin, designated Epoxy-A, in the formulation as the second resin. Table 3 summarizes the inventive formulation that was prepared for this example and the conductivity and surface roughness values measured for each.

TABLE 3

COMPOSITION AND PERFORMANCE OF INVENTIVE FORMULATION E

| Component | Material | Inventive Formulation E |
|---|---|---|
| First resin, wt % | Bismaleimide-B | 9.406 |
| Solvent 1, wt % | Tetramethyl urea | 9.406 |
| Solvent 2, wt % | 2-(2-Ethoxyethoxy) ethyl acetate | 2.033 |
| Filler 1, wt % | Ag flake, 1 μm avg. | 75 |
| Curing Agent 1, wt % | Cumene hydroperoxide | 0.188 |
| Curing Agent 2, wt % | 3-3' Diamino diphenyl sulfone | 1.881 |
| Second resin, wt % | Epoxy-A | 1.881 |
| Inhibitor, wt % | Methylhydroquinone | 0.017 |
| Conductivity Promoter, wt % | Adipic acid | 0.188 |
| Volume Resistivity, ohms-cm | | 0.00009 |
| Thermal Conductivity, W/mK | | 9.15 |
| Rz | | 2.9 |

Inventive Formulation E demonstrated good thermal and electrical conductivity and very low surface roughness.

Example 4

One Liquid Second Resin in Formulation

An additional inventive formulation was prepared which just one liquid second resin in the formulation (Oligomer-A). Table 4 summarizes the inventive formulation that was prepared for this example and the conductivity and surface roughness values measured for each

TABLE 4

COMPOSITION AND PERFORMANCE OF INVENTIVE FORMULATION F

| Component | Material | Inventive Formulation F |
|---|---|---|
| First resin, wt % | Bismaleimide-B | 11.072 |
| Solvent 1, wt % | Tetramethyl urea | 11.072 |
| Solvent 2, wt % | 2-(2-Ethoxyethoxy) ethyl acetate | 0.18 |
| Filler 1, wt % | Ag flake, 1 μm avg. | 75 |
| Curing Agent 1, wt % | Cumene hydroperoxide | 0.188 |
| Second resin, wt % | Oligomer-A | 2.214 |
| Inhibitor, wt % | Methylhydroquinone | 0.02 |
| Conductivity Promoter, wt % | Adipic acid | 0.221 |
| Volume Resistivity, ohms-cm | | 0.00006 |
| Thermal Conductivity, W/mK | | 17.31 |
| Rz | | 2.8 |

Inventive Forumualtion F demonstrated good thermal an electrical conductivity and very low surface roughness.

Example 5

High Melting Point Bisamaleimide as First Resin

An additional inventive formulation was prepared using a solid bismaleimide with a melting point range of 160°-170° C. (designated Bismaleimide-D) as the first resin. In this example the Bismaleimide-D was dissolved in a mixed solvent of tetramethyl urea and N-Methylpyrrolidone. Table 5 summarizes the inventive formulation that was prepared for this example and the conductivity and surface roughness values measured for each.

TABLE 5

COMPOSITION AND PERFORMANCE OF INVENTIVE FORMULATION G

| Component | Material | Inventive Formulation G |
|---|---|---|
| First resin, wt % | Bismaleimide-D | 10.343 |
| Solvent 1, wt % | Tetramethyl urea | 4.483 |
| Solvent 2, wt % | N-methylpyrrolidone | 5.517 |
| Solvent 3, wt % | 2-(2-Ethoxyethoxy) ethyl acetate | 0.165 |
| Filler 1, wt % | Ag flake, 1 μm avg. | 75 |
| Curing Agent 1, wt % | Cumene hydroperoxide | 0.203 |
| Second resin 1, wt % | Oligomer-A | 2.034 |
| Second resin 2, 2t % | Bismaleimide-C | 2.034 |
| Inhibitor, wt % | Methylhydroquinone | 0.018 |
| Conductivity Promoter, wt % | Adipic acid | 0.203 |
| Volume Resistivity, ohms-cm | | 0.00007 |
| Thermal Conductivity, W/mK | | 15.2 |
| Rz | | 5.3 |

Inventive Formulation G, with its first resin having a softening point above the B-staging temperature, demonstrated good thermal and electrical conductivity and low surface roughness.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

What is claimed:

1. A semiconductor wafer having a front side that is active and a back side that is opposed to the front side that is inactive wherein the back side of the semiconductor wafer is coated with a conductive composition comprising:
    a) 66 to 80 wt % conductive filler that has an average particle size of less than 2 microns and a maximum particle size of less than 5 microns,
    b) 5 to 25 wt % first resin that has a softening point between 80-260° C.,
    c) 5 to 25 wt % solvent,
    d) 0 to 5 wt % curing agent, and
    e) 0 to 20 wt % second resin,
    wherein at room temperature the first resin is substantially soluble in the solvent.

2. The semiconductor wafer of claim 1 wherein the conductive filler is silver and the silver has a surface area of at least 1 m$^2$/g.

3. The semiconductor wafer of claim 1 wherein the first resin is a bismaleimide.

4. The semiconductor wafer of claim 1 wherein the solvent is tetramethyl urea.

5. The semiconductor wafer of claim 1 wherein the second resin is selected from the group consisting of bismaleimide, epoxy, and acrylate.

6. The semiconductor wafer of claim 1 wherein the conductive filler is silver, the first resin is a bismaleimide, and the solvent is tetramethyl urea, wherein the sliver has a surface area of at least 1 m$^2$/g.

* * * * *